United States Patent
Ulloa Paredes et al.

(10) Patent No.: US 10,019,671 B2
(45) Date of Patent: Jul. 10, 2018

(54) LEARNING MOBILITY USER CHOICE AND DEMAND MODELS FROM PUBLIC TRANSPORT FARE COLLECTION DATA

(71) Applicant: Conduent Business Services, LLC, Dallas, TX (US)

(72) Inventors: Luis Rafael Ulloa Paredes, Meylan (FR); Guillaume M. Bouchard, Saint-Martin-le-Vinoux (FR); Frederic Roulland, Le Versoud (FR); Arturo Mondragon Cardenas, Fontaine (FR)

(73) Assignee: Conduent Business Services, LLC, Dallas, TX (US)

( * ) Notice: Subject to any disclaimer, the term of this patent is extended or adjusted under 35 U.S.C. 154(b) by 487 days.

(21) Appl. No.: 14/737,964

(22) Filed: Jun. 12, 2015

(65) Prior Publication Data

US 2016/0364645 A1    Dec. 15, 2016

(51) Int. Cl.
| | |
|---|---|
| G06N 5/02 | (2006.01) |
| G08G 1/01 | (2006.01) |
| G06F 17/50 | (2006.01) |
| G06Q 10/04 | (2012.01) |

(52) U.S. Cl.
CPC .......... G06N 5/02 (2013.01); G06F 17/5009 (2013.01); G06Q 10/047 (2013.01); G08G 1/0129 (2013.01)

(58) Field of Classification Search
CPC ........ G06N 5/02; G06N 5/04; G06F 17/5009; G06Q 10/047; G08G 1/0129; G08G 1/005; G08G 1/0116; G08G 1/207

USPC .......................................................... 706/46
See application file for complete search history.

(56) References Cited

U.S. PATENT DOCUMENTS

| | | | |
|---|---|---|---|
| 2013/0046456 A1* | 2/2013 | Scofield ............ | G01C 21/3423 701/117 |
| 2013/0317742 A1* | 11/2013 | Ulloa Paredes ..... | G06Q 10/063 701/533 |
| 2013/0317747 A1* | 11/2013 | Chidlovskii ............. | G06N 5/02 701/540 |
| 2013/0317884 A1* | 11/2013 | Chidlovskii ......... | G06Q 10/063 705/7.31 |

(Continued)

OTHER PUBLICATIONS

Wilson N. et al., "Schedule-Based Modeling of Transportation Networks: theory and applications", Springer. (Year: 2009).*

(Continued)

*Primary Examiner* — Dave Misir
(74) *Attorney, Agent, or Firm* — Fay Sharpe LLP

(57) ABSTRACT

A method and system are disclosed for learning a demand model and simulation parameters from validation information. Validation information is received from automatic fare collection systems and trips are reconstructed from the validation information. Origins, destinations, and arrival/departure times are estimated from the reconstructed trips. A demand model is then generated from the origins, destinations, and times. Assignment model parameters are then learned from the received validation information and demand model via iterative simulations. Infrastructure changes are made to a simulated transportation network based on the assignment and demand model using the learned parameters. A simulated response of the transportation network to the infrastructure change is then output.

17 Claims, 9 Drawing Sheets

(56) References Cited

U.S. PATENT DOCUMENTS

| | | | | |
|---|---|---|---|---|
| 2014/0035921 | A1* | 2/2014 | Yeh | G06T 11/206 |
| | | | | 345/440 |
| 2014/0089036 | A1* | 3/2014 | Chidlovskii | G06Q 10/06 |
| | | | | 705/7.27 |
| 2015/0006071 | A1* | 1/2015 | Cai | G01C 21/3492 |
| | | | | 701/400 |
| 2015/0177011 | A1* | 6/2015 | Ibrahimi | G01C 21/343 |
| | | | | 701/465 |
| 2015/0294566 | A1* | 10/2015 | Huang | G05D 1/0261 |
| | | | | 701/41 |
| 2017/0011629 | A1* | 1/2017 | Lau | G08G 1/127 |

OTHER PUBLICATIONS

Neumann, A., & Balmer, M. (2011). *Micro meets macro: A combined approach for a large-scale, agent-based, multi-modal and dynamic transport model for Berlin.* Berlin: Transport Systems Planning and Transport Telematics.

Meignan, D., Simonin, O., & Koukam, A. (2007). Simulation and evaluation of urban bus-networks using a multiagent approach. Simulation Modelling Practice and Theory, 15 (6), 659-671.

Wahba, M. M. (2008). MILATRAS—Microsimulation Learning-based Approach to Transit Assignment. University of Toronto, Graduate Department of Civil Engineering.

Toledo, T., Cats, O., Burghout, W., & Koutsopoulos, H. N. (2010). Mesoscopic simulation for transit operations. Transportation Research Part C: Emerging Technologies, 18 (6), 896-908.

* cited by examiner

LEARNING MOBILITY USER CHOICE AND DEMAND MODELS FROM PUBLIC TRANSPORT FARE COLLECTION DATA

BACKGROUND

The transportation arts, transportation system arts, the public transit infrastructure arts, the data processing arts, the data analysis arts, the transportation modeling arts, the predictive arts, and the like.

Improving the transportation of urban areas is a constant challenge for any transportation authority. This challenge is becoming even larger within the fast growing mega cities over the world. These fast growing cities will have to solve the issues of traffic congestion and pollution if they want to stay attractive and continue their economic growth. Planning new infrastructure, in particular for public transit, is one important dimension where transportation authorities can act. However development of infrastructure is costly, time consuming, and heavy work for a city. Past such development required therefore a very careful study of the mobility needs and simulation of different alternatives before taking such decision.

Currently, the planning of a new transportation infrastructure involves simulation of several options based on an understanding of the city. This understanding of the city is primarily based upon a custom study. This custom study generally consists of a period of m collection of data and traveler/citizen surveys, which are then aggregated into a model of the city by some expert analysts. This approach is very time consuming and expensive, and therefore, it often has the disadvantages to rely only on very partial data (only few thousands of people surveyed) or non-up-to-date data (e.g., global census of 5 years ago). Furthermore aggregating this data into a model is such an enormous work that data are often aggregated to a high level of granularity, which allows only a macro simulation of the city mobility dynamics. The cost/precision ratio of simulations built from these custom studies is therefore not optimal.

The fielding of more and more intelligent transportation systems allows the collection of millions of transactions which constitute a very detailed source of information. This is for example, public transportation ticketing data that are collected from automatic fare collection systems each time a passenger checks-in (and sometimes checks-out) before boarding (alighting) a vehicle. Currently, this collected ticketing data has been very limitedly used for understanding mobility patterns of a city. What is needed is a mechanism that will use this data in order to learn automatically city models that can then be used for simulation and planning of new infrastructure, as well as increase significantly the planning cost/precision ratio through the integration of a much more massive, more up to date set of information, in an automated manner.

Thus, it would be advantageous to provide an effective system and method for learning transportation models of an associated transportation system, including demand models estimating the geographical location in the city of a traveler's actual origin and destination to facilitate infrastructure planning.

INCORPORATION BY REFERENCE

The following references, the disclosures of which are incorporated herein by reference, in their entirety, are mentioned.

Neumann, A., & Balmer, M. (2011). *Micro meets macro: A combined approach for a large-scale, agent-based, multimodal and dynamic transport model for Berlin*. Berlin: Transport Systems Planning and Transport Telematics.

Meignan, D., Simonin, O., & Koukam, A. (2007). Simulation and evaluation of urban bus-networks using a multiagent approach. *Simulation Modelling Practice and Theory*, 15 (6), 659-671.

Wahba, M. M. (2008). MILATRAS—Microsimulation Learning-based Approach to Transit Assignment. University of Toronto, Graduate Department of Civil Engineering.

Toledo, T., Cats, O., Burghout, W., & Koutsopoulos, H. N. (2010). Mesoscopic simulation for transit operations. *Transportation Research Part C: Emerging Technologies*, 18 (6), 896-908.

US Patent Application Publication No. 2013/0317742 A1 (Publication Date: Nov. 28, 2013; application Ser. No. 13/481,042, Filed May 25, 2012), entitled SYSTEM AND METHOD FOR ESTIMATING ORIGINS AND DESTINATIONS FROM IDENTIFIED END-POINT TIME-LOCATION STAMPS, to Ulloa Paredes et al.

US Patent Application Publication No. 2013/0317884 A1 (Publication Date: Nov. 28, 2013; application Ser. No. 13/480,802, Filed May 25, 2012), entitled SYSTEM AND METHOD FOR ESTIMATING A DYNAMIC ORIGIN-DESTINATION MATRIX, to Chidlovskii.

BRIEF DESCRIPTION

In one aspect of the exemplary embodiment, a method for learning transportation models is provided. The method includes receiving validation information from at least one ticketing validation system, the validation information including at least one of a timestamp, a location, or a ticket identification of a traveler on the associated transportation network. The method further includes reconstructing each of a plurality of trips in accordance with the received validation information, and estimating an origin and a destination from the reconstructed plurality of trips. In addition, the method for learning transportation models includes estimating at least one of an arrival time or a destination time corresponding to the reconstructed trip, and generating a demand model of the associated transportation network in accordance with the estimated origin, destination and time. Furthermore, at least one of the receiving, reconstructing, estimating, and generating is performed by a computer processor.

In another aspect, a system for learning transportation models is provided. The system includes a demand model construction component that includes a trip reconstruction module configured to receive validation information from at least one ticketing validation system and reconstruct a plurality of trips on the associated transportation network, an origin and destination estimator configured to estimate an origin and a destination for each of the plurality of reconstructed trips, and a time estimator configured to estimate at least one of an arrival time or a destination time for each of the plurality of reconstructed trips. The system further includes an assignment model component that includes a traveler model component including a trip planner, a vehicle model component, and a simulator. In addition, the system includes a memory, and a processor in communication with the memory which stores instructions that are executed by the processor to generate a demand model in accordance with estimated origins, destinations, and times, and retrieve, from an associated database, an assignment model corresponding to the associated transportation network. The instructions stored in memory are also executed by the processor to input, into the retrieved assignment model, a vehicle model of the associated transportation network, the vehicle model corresponding to operations of vehicles on the associated transportation network, and simulate the assignment model to determine a set of simulated trips. The instructions stored in memory also direct the processor to determine a difference between the set of simulated trips and the plurality of reconstructed trips, iteratively simulate the assignment model with different parameter values responsive to a determined difference, and output a set of parameter values for predictive modeling of the transportation network.

In another aspect, a computer-implemented method for learning transportation models is provided. The method includes receiving validation information from at least one ticketing validation system, the validation information including at least one of a timestamp, a location, or a ticket identification of a traveler on the associated transportation network. The computer-implemented method further includes reconstructing each of a plurality of trips in accordance with the received validation information, and estimating an origin and a destination from the reconstructed plurality of trips, wherein for each user having historical data associated therewith, determining the origin and the destination from a linear combination of a distribution of stops around each of a first observed boarding and a last observed alighting. In addition, the method also comprises estimating at least one of an arrival time or a destination time corresponding to the reconstructed trip, and generating a demand model of the associated transportation network in accordance with the estimated origin, destination and time.

DETAILED DESCRIPTION

Figure 1A:
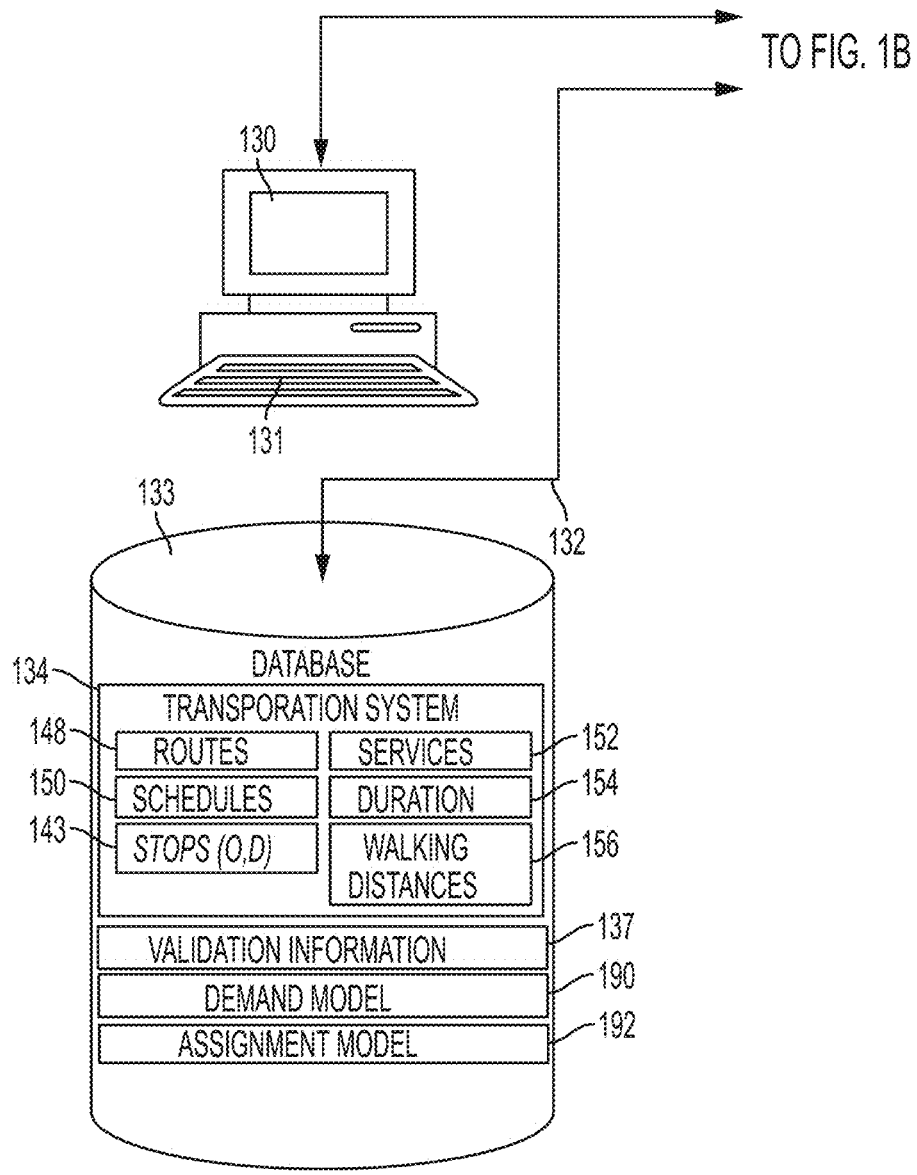
FIGS. 1A-1B illustrates a functional block diagram of a system for learning transportation models in accordance with one aspect of the exemplary embodiment.

One or more embodiments will now be described with reference to the attached drawings, wherein like reference numerals are used to refer to like elements throughout. Aspects of exemplary embodiments related to systems and methods for re-ranking trips on an associated transportation network are described herein.

The systems and methods set forth herein utilize fare collection data, i.e., validation information 137, in order to build both the demand model and to learn optimal user choice and demand model parameters. Automatic fare collection data systems provide the full list of validations made by passengers through their use of the transportation systems. In most of the transportation systems people will validate when they enter a vehicle (check-in). Few systems will also ask to validate when they leave the vehicle (check-in/checkout). In many systems regular users will use a transportation medium such as a smart card that will provide a unique identifier of the user for all the validations she performs. Fare collection data constitutes a source of information that covers the whole population of users and the whole history of interactions of these users with the transportation systems.

Figure 1B:
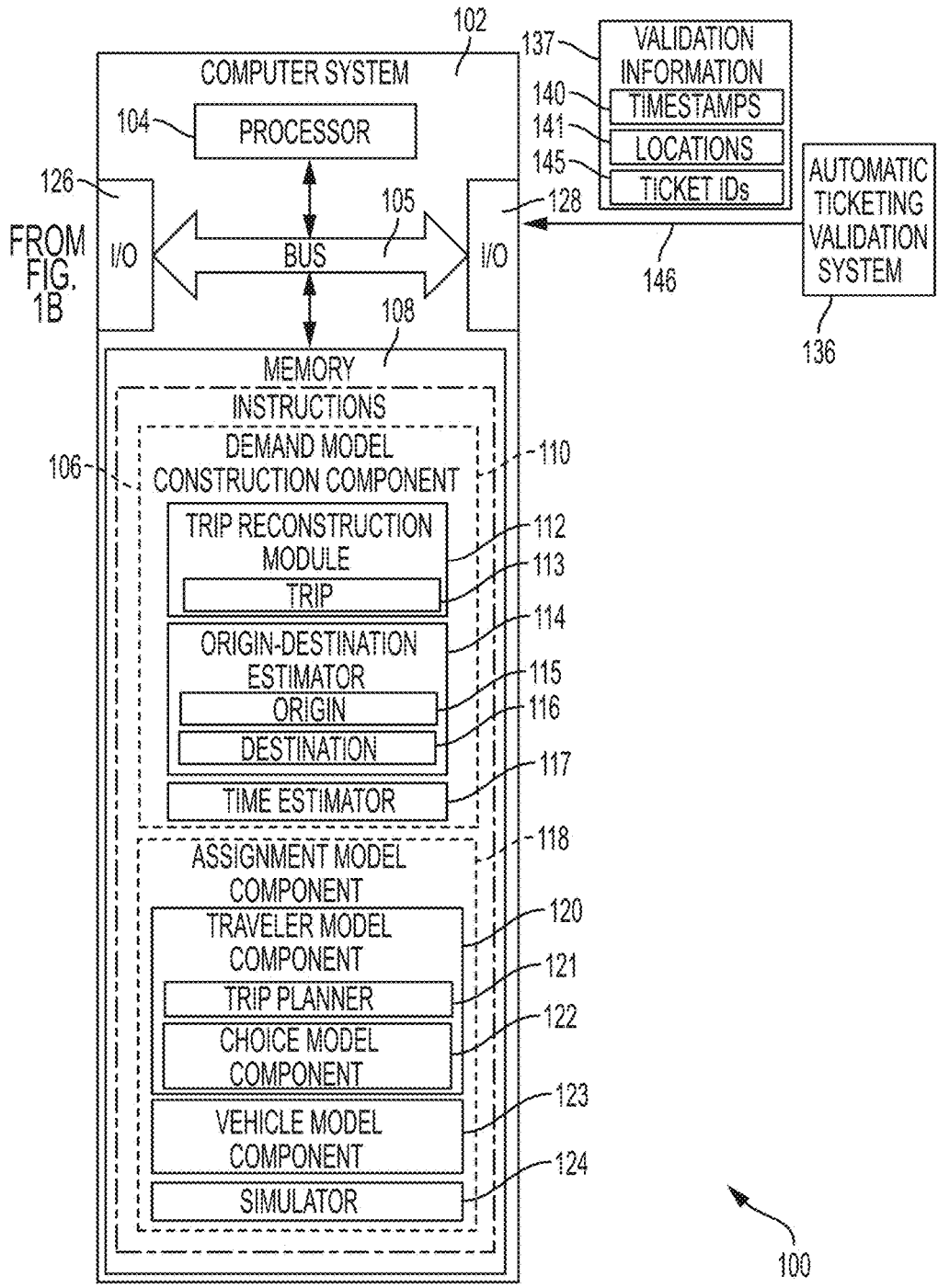

Referring now to FIGS. 1A-1B, there is shown a system 100 for learning transportation models based on ticketing data. The system 100 utilizes the validation data 137 collected by automatic ticketing validation systems 136 employed by various components of an associated transportation system 134. As used herein, the terms "transportation system" and "transportation network" are considered equivalent, referencing a network or system of public transportation such as buses, trams, trains, and the like. It will be appreciated that the various components depicted in FIGS. 1A-1B are for purposes of illustrating aspects of the exemplary hardware, software, or a combination thereof, are capable of being substituted therein.

It will be appreciated that the transportation model learning system 100 of FIGS. 1A-1B is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or the any suitable combination thereof. Accordingly, such a computer network comprises physical layers and transport layers, as illustrated by various conventional data transport mechanisms, such as, for example and without limitation, Token-Ring, Ethernet, or other wireless or wire-based data communication mechanisms. Furthermore, while depicted in FIGS. 1A-1B as a networked set of components, the system and method are capable of implementation on a stand-alone device adapted to perform the methods described herein.

As shown in FIGS. 1A-1B, the transportation model learning system 100 includes a computer system 102, which is capable of implementing the exemplary method described below. The computer system 102 may include a computer server, workstation, personal computer, laptop computer, cellular telephone, tablet computer, pager, combination thereof, or other computing device capable of executing instructions for performing the exemplary method.

According to one example embodiment, the computer system 102 includes hardware, software, and/or any suitable combination thereof, configured to interact with an associated user, a networked device, networked storage, remote devices, or the like. The exemplary computer system 102 includes a processor 104, which performs the exemplary method by execution of processing instructions 106 which are stored in memory 108 connected to the processor 104, as well as controlling the overall operation of the computer system 102.

The instructions 106 include a demand model construction component 110 for generating a demand model 190 that includes a trip reconstruction module 112 that receives validation information 137 from one or more automatic ticketing validation systems 136 associated with the transportation network 134. A demand model 190 describes what needs of different people in terms of transportation, generally represented by an origin-destination-time ("ODT") matrix where each row represents a user's travel needs with three dimensions: origin of the trip, destination of the trip, and time (either departure or arrival). The validation information 137 is utilized by the trip extractor 110 to extract a trip 113 that a traveler actually took on the transportation network 134, which trip 113 may then be utilized by the origin and destination estimator 114, as discussed below. The validation information 137 may include, for example, timestamps 140, locations 141, ticket identification 145, and the like. The trip reconstruction module 112 may process the received validation information 137 to determine an origin 142 and a destination 144 for the particular ticket identification 145 associated with a particular traveler. That is, the trip reconstruction module 112 may derive, from the timestamps 140 and locations 141 contained in the validation information 137, i.e., the origin 142 of the traveler, and deduce, calculate, or otherwise determine the corresponding destination 144 of that traveler. The trip reconstruction module 112 may then output a trip 113 that corresponds to the actual journey the corresponding traveler (i.e., ticket identification 145) took on the transportation system 134. Various embodiments of the subject application may utilize the collection of additional information from the automatic ticketing validation system 136, e.g., validation sequences (set of boarding and alighting validations with corresponding timestamps over a particular period of time), or the like, from which additional information trips 113 may be reconstructed by the trip reconstruction module 112.

Figure 2:
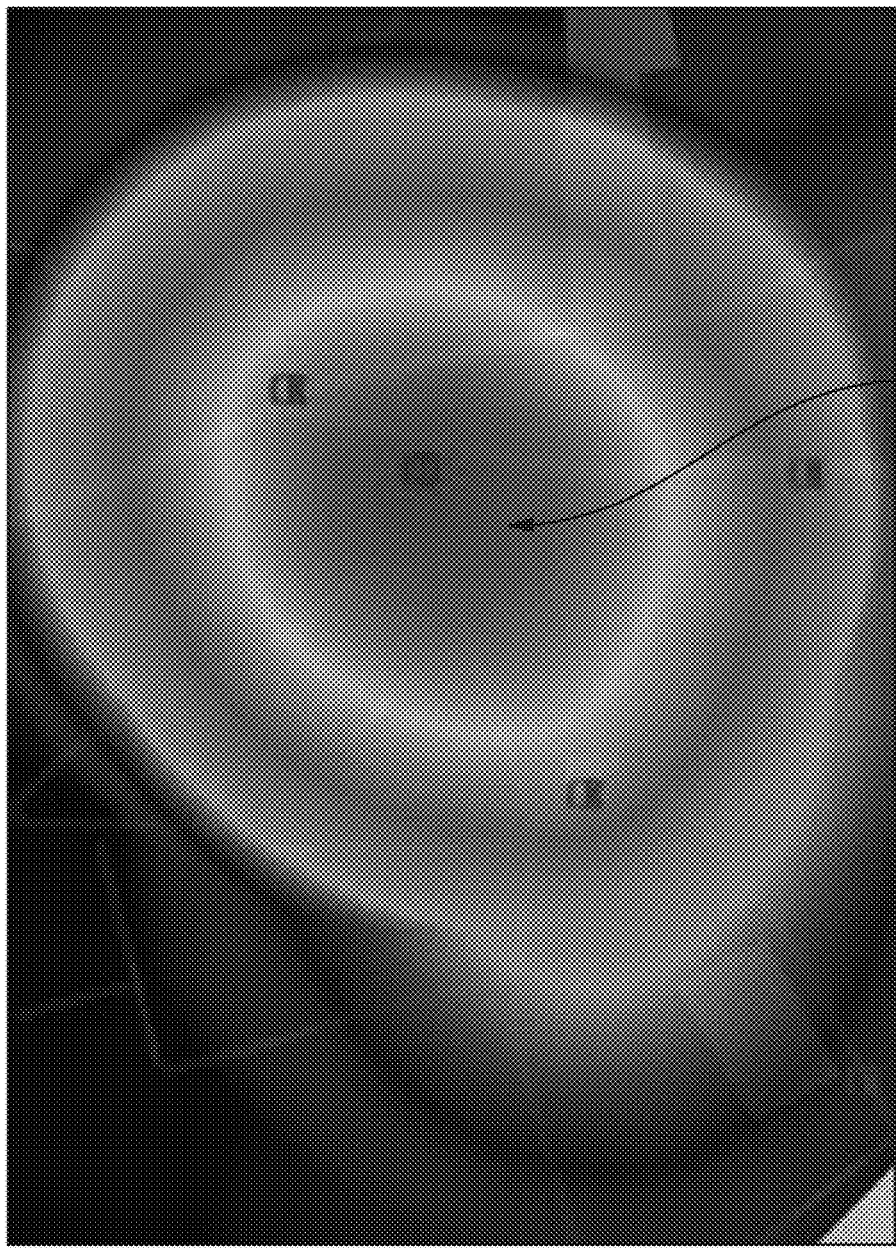
FIG. 2 illustrates an example of an estimated origin distribution of a trip in accordance with one aspect of the exemplary embodiment.

The demand model construction component 110 of instructions 106 further includes an origin and destination estimator 114 that estimates the actual origin 115 and destination 116 of each trip 113. According to one embodiment, a stochastic modeling of location may be utilized to estimate the origin 115 and destination 116 for each trip 113 output by the trip reconstruction module 112. Such a stochastic model may assume that the actual origin 115 or destination 116 of a trip 113 is distributed in a circle around the first boarding or last alighting of the trip 113. Suitable examples of such modeling may include, for example and without limitation, a parameterized function such as a uniform or a Gaussian distribution. When the traveller making the trip 113 is a regular user, historical data, i.e., the historical profile, of the traveller may be used. All instances of travel that can be associated to the same activity (i.e., a morning trip going from a recurring area of the city to another recurrent area) are then grouped together. The origin and destination are then modelled from the linear combination of the distribution around each observed first boarding/last alighting. The weight associated to each stop distribution depends on the frequency of the observation of this stop. FIG. 2 shows an example of such distribution obtained. The area denoted by reference number 200 illustrates where the probability of the actual origin is high. In this example, the user boarded at the central bus top most of the time but we can also see that there are few instances where she is boarding at other stops that influence the shape of the distribution.

The demand model construction component 110 of the instructions 106 may also include a time estimator 117 that estimates the arrival time and/or departure time of a traveler on a trip 113 to or from the estimated origin 115 or destination 116. The time estimator 117 first determines whether to model the trip 113 with respect to its departure time or its arrival time. It will be appreciated that this choice can be done arbitrarily based on the prior knowledge about the population being simulated or through a profiling of the trip 113 reconstructed from the fare collection data. Such profiling would enable determining whether the constraint is to arrive before a specific time at the destination (e.g., 'going to an appointment' profile) or if the constraint is to leave origin after a specific time (e.g., 'coming back from school' profile).

The time estimator 117 then estimates the time to leave the origin 115 or to arrive at a destination 116 depending upon whether the trip 113 is one for which there is no or there is traveller history. For a trip 113 having no traveller/user history, the arrival time may be computed by taking the observed time of the last alighting and add an estimated walking duration to go to the final destination from the vehicle stop. The simulation will use this value to model a distribution of possible arrival time upper bounded by that computed time, so that no travel plan proposed to the traveller during the simulation will arrive later than that time. The departure time for a trip 113 with no traveller history may be computed by taking the observed time of the first boarding and add an estimated walking duration to go from the origin 115 to the vehicle stop. The simulation will use this value to model a distribution of possible departure times lower bounded by that computed time, so that no travel plan proposed to the traveller during the simulation will leave earlier than that time.

For a trip 113 having traveller history, the arrival time may be computed by taking the observed time of the last alighting and add an estimated walking duration to go to the final destination from the vehicle stop for each of the instances of this type of trip in the history. The simulation will use a histogram distribution of possible arrival time built from these computed times. The departure time may be computed by taking the observed time of the first boarding and add an estimated walking duration to go from the origin 115 to the vehicle stop for each of the instances of this type of trip in the history. The simulation may use a histogram distribution of possible departure time built from these computed times.

The instructions 106 further includes an assignment model component 118, which generates and simulates a corresponding assignment model 192, and which includes a traveler model component 120. An assignment model 192, stored in the associated database 130, defines how travel needs will be allocated within a given transportation infrastructure. A large variety of assignment models exist, from the macro to the micro level. In the case of public transport modeling with a micro-simulation approach, each passenger's and each vehicle's behavior is modeled individually, i.e., the simulation will simulate the activity of all the vehicles and all the people travelling during the time interval of the simulation. The passenger tries to accomplish her travel objective and her behavior is modelled through a user choice model (discussed below) that defines all the decisions that she will have to make during her travel on the transportation network 134.

The traveler model component 120 includes a trip planner 121 configured to a set of candidate trips for a user to take, i.e., one or more paths between a selected origin and a selected destination. As will be appreciated, the trip planner 121 may facilitate the determination of one or more paths between stops 143 associated with the selected origin and destination, using the routes 148, schedules 150, durations 154, walking distances 156, stops 143, and services 152 (e.g., bus, train, subway, etc.) associated with a transportation system 134. The trip planner 121 may determine one or more paths between the selected origin and destination as provided by the user and output a top list of trips. It will be appreciated that when determining a trip between the selected origin and the destination, the trip planner 121 may use an abstract model of the transportation network 134, i.e., a model based on the routes 148 and schedules 150, as well as other information available to the trip planner 121 regarding the transportation network 134, user preferences, and the like. The trip planner 121 may have access to the data stored on the database 130 in communication with the computer system 102, may have data related to the transportation system 134, e.g., routes 148, schedules 150, stops 143, services 152, etc., stored on a separate database (not shown) in communication therewith. The trip planner 121 may further be in communication with an associated database (not shown) that stores previously generated lists of journeys or trips responsive to particular origin/destination pairs, and the illustration in FIGS. 1A-1B is intended as one example implementation of the aforementioned trip planner 121.

As will be appreciated, a suitable trip planner 121 for a public transportation network 134 is configured to provide information about available public transport journeys, or trips. Input for the journey planner 121 includes an origin, a destination and starting time (departure time), and finds a route from origin to destination using available services of the transportation network 134. It will be understood that the choice of routes for the trip planner 121 on a public transportation network 134 is more constrained than for a road route planner, moreover it is not only about choosing a route but also about choosing a service on that route.

The trip planner 121 finds one or more suggested journeys between an origin and a destination. In accordance with one embodiment, the trip planner 121 uses a search algorithm to search a graph of nodes (representing access points to the transport network 134) and edges (representing possible journeys between points). Different weightings such as distance, cost or accessibility may be associated with each edge. Searches may be optimised on different criteria, for example fastest, shortest, least changes, cheapest. They may be constrained for example to leave or arrive at a certain time, to avoid certain waypoints, etc. Such a trip planner 121 usually disposes multiple sources of public and private information, including the detailed network description, available routes, stop locations, the service schedule, walking distances etc. in order to better answer the trip queries, e.g., queries relating to the trips 113, simulations, and the like.

The traveler model component of the assignment model component 118 stored in memory 106 further includes a user choice model component 122. The user choice model component 122 is configured to model each traveler's decisions and behaviors within a simulation. Using an output of the trip planner 121, the user choice model component 122 simulates what will be the choice of the user at all decision points, e.g., when walking to a stop: which stop, when to leave, what speed to walk; when being at a stop: which line, which vehicle to board; when being in a vehicle: at which stop to leave. In accordance with one embodiment, the validation information 137 may be used by the model component to determine, or learn, the best parameter values for the user choice model component 122.

The assignment model component 118 further includes a vehicle model component 123. The vehicle model component 123 generates a vehicle model of the transportation network 134 regarding the type of vehicle (bus, tram, train, etc.), vehicle movement, vehicle speeds, stop arrival times, stop departure times, and the like.

The assignment model component 118 also includes a simulator 124 configured to simulate various aspects of the transportation network 134. In one embodiment, the demand model construction model component 110 outputs a demand matrix, i.e., the demand model 190, that has been constructed from the validation information 137 as discussed above. The aforementioned validation information 137 may also be used for learning which parameter's values to use for the simulation models. The simulator 124 may operate in two modes: a training mode where best parameters values are selected based on learning from the existing transportation infrastructure usage and a prediction mode where the selected parameters values are used for simulating the transit on a new infrastructure.

In training mode, the demand model generated from the validation information of one past period is used. The assignment model component 118 stored of the instructions 106 forces the public transportation vehicles to follow the exact same behaviors that were observed for this period. The simulator 124 outputs a set of trips (using the aforementioned trip planner 121) with simulated boarding and alighting events that can be compared directly with the individual trips 113 reconstructed (via the trip reconstruction module 112) from validation information 137 when building the demand model. The simulator 124 then iterates with different parameter values and ends once the simulation output and the original reconstructed trip are judged to be close enough. Likewise passenger flows in vehicles can be forced to learn vehicle's parameters. In this phase the period used for building the demand model may vary from one instance to the other in order to avoid finding parameters which are only optimal for the training period and to allow cross validating results.

In prediction mode a demand model may be built by the demand model construction component 110 from a past period which is considered to be representative of the demand for which simulation of new transportation infrastructure is desired. In such a mode of operation, both vehicles and traveler behaviors are simulated by the simulator 124. User choices are based on the assignment model 192 parameterized with the best values obtained in training phase.

Returning to FIGS. 1A-1B, the memory 108 may represent any type of non-transitory computer readable medium such as random access memory (RAM), read only memory (ROM), magnetic disk or tape, optical disk, flash memory, or holographic memory. In one embodiment, the memory 108 comprises a combination of random access memory and read only memory. In some embodiments, the processor 104 and memory 108 may be combined in a single chip. The network interface(s) 120, 122 allow the computer to communicate with other devices via a computer network, and may comprise a modulator/demodulator (MODEM). Memory 108 may store data the processed in the method as well as the instructions for performing the exemplary method.

The digital processor 104 can be variously embodied, such as by a single core processor, a dual core processor (or more generally by a multiple core processor), a digital processor and cooperating math coprocessor, a digital controller, or the like. The digital processor 104, in addition to controlling the operation of the computer 102, executes instructions 106 stored in memory 108 for performing the method outlined in FIGS. 4A-4B.

The term "software," as used herein, is intended to encompass any collection or set of instructions executable by a computer or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, Internet-based programs stored on a remote server or so forth, source code, interpretive code, object code, directly executable code, and so forth. It is contemplated that the software may invoke system-level code or calls to other software residing on a server or other location to perform certain functions.

The computer system 102 also includes one or more input/output (I/O) interface devices 126 and 128 for communicating with external devices. The I/O interface 126 may communicate with one or more of a display device 130, for displaying information, and a user input device 132, such as a keyboard or touch or writable screen, for inputting text, and/or a cursor control device, such as mouse, trackball, or the like, for communicating user input information and command selections to the processor 104. The various components of the computer system 102 may all be connected by a data/control bus 105. The processor 104 of the computer system 102 is in communication with an associated database 133 via a link 132. A suitable communications link 132 may include, for example, the public switched telephone network, a proprietary communications network, infrared, optical, or other suitable wired or wireless data transmission communications. The database 133 is capable of implementation on components of the computer system 102, e.g., stored in local memory 108, i.e., on hard drives, virtual drives, or the like, or on remote memory accessible to the computer system 102.

The associated database 133 corresponds to any organized collections of data (e.g., validation information, transportation system information (e.g., stops, nodes or stations, schedules, routes), crowdsourcing information (e.g., possible paths, durations, frequency of travel, expected transfer times), and the like) used for one or more purposes. Implementation of the associated database 133 is capable of occurring on any mass storage device(s), for example, magnetic storage drives, a hard disk drive, optical storage devices, flash memory devices, or a suitable combination thereof. The associated database 133 may be implemented as a component of the computer system 102, e.g., resident in memory 108, or the like.

In one embodiment, the associated database 133 may include data corresponding to an associated transportation system 134, a collection of routes 148 (a sequence of stops at transportation nodes to be made by an individual vehicle along of a course of travel available on the transportation system 134), schedules 150 for each of these routes 148, transportation nodes, such as stations or stops 143, paths (i.e., a sequence of successive origins and destinations between a first origin and the last destination, services 152, duration 154, walking distances 156, demand models 190, and assignment models 192. For example, in the case of a public transportation system, the associated database 133 may include information relating to the public transportation system 134 such as public transportation routes (e.g., a known sequence of scheduled stops by an individual bus, subway, train, etc.) 148, schedules 150 that pertain to the arrival/departure times of buses, trams, subways, etc., of the transportation system 134 for these routes 148, public transportation stops (or stations) 143, i.e., fixed locations, or nodes, that are linked by the transportation system 134, and a set of paths between two stops 143, each path being associable with one or more transportation routes 148 (e.g., a path may include beginning a journey by train at a first station (origin), riding the train (along the train's scheduled route) to a second station, transferring to a bus at the second station, and riding the bus (along the bus's scheduled route) so as to alight at a third station (destination)).

The database 133 may further include validation information 137 collected from the automatic ticketing validation system 136. For example, in the context of a public transportation system, the validation information 137 may pertain to travelers, such as each ticket's unique identification 145 (e.g., the ticket identification 145 may be derived from a smart card, a transit card, transit ticket, or the like, that cannot be rewritten or otherwise altered by the user (anticounterfeiting properties)), locations 141 (origin and destination locations), sequence tags (first use, correspondence use, etc.,), timestamps 140 associated with the transfer times between an origin and a destination for that particular validation sequence. That is, each validation sequence may include the time of entry of the traveler on the public transportation network 134 along with the corresponding location 141 or route 148 (i.e., stop 143 on the route 148) at which the traveler boarded or alighted, and the like. While each traveler on a public transport system is generally a person, travelers of other networked transportation systems may include goods or other inanimate objects.

Each location 141 of the validation information 137 may include one or more of a route identifier e.g., a route number, a transportation node identifier, e.g., a stop number, an address, GPS coordinates, or other geographical identification information associated with the location. The time component of the stamp 140 may include one or more of a time of day, a day, a date, or other temporal information corresponding to the timestamp 140. The validation information 137 collected and used in the various embodiments contemplated herein may thus be ticketing data, collected via usage of prepaid cards, single use transit tickets, reloadable transit cards, or other ticketing devices. The above references sequence tags may reflect where or when in the a particular validation sequence the boarding or alighting of the traveler occurred, i.e., a "First" tag may indicate the first use of the ticket identification 145, whereas a "Correspondence" tag may indicate the second and each subsequent use of the ticket identification 145 within a specified time period.

The validation information 137 may be collected from a plurality of locations on the associated transportation system 134. As briefly discussed above, each of these locations may correspond to one of a finite set of locations (e.g., stations, stops, etc.) connected by the transportation system 134, or vehicles which travel along routes 148 of the transportation system 134. It will be appreciated that the collection of such information 137 may be performed by ticket validation machines for fare collection, i.e., automatic ticket validation systems 136 at each respective location, such as smart card readers, magnetic card readers, input terminals, ticket dispensers, ticket readers, and the like. It will be appreciated that such automatic ticket validation systems may be implemented at stations, on vehicles, etc., and may represent automatic fare collection subsystems.

Various travelers on the transportation system 134 may use transportation cards/tickets. Such cards/tickets may be used to pay for or otherwise enable travel on the transportation system 134 and thus are scanned, read, inserted in, or otherwise detected by the automatic ticket validation systems 136 as the travelers travel through the transportation system 134 from an origin location 142 to a destination location 144. Such transportation cards may include smart card-like capabilities, e.g., microchip transmissions, magnetically stored data, and the like. In such embodiments, the automatic ticket validation systems 136 communicate validation information 136 to the computer system 102 via link 146. A suitable communications link 146 may include, for example, the public switched telephone network, a proprietary communications network, infrared, optical, or any other suitable wired or wireless data transmission communications.

It will be appreciated that additional information may be collected by the automatic ticket validation systems 136 corresponding to ticketing operations including transportation usage data, ticketing receipt data, congestion data, and the like. According to one embodiment, both entries and exits of passengers on and off vehicles or nodes of the transportation system 134 may be collected as validation information 137. Entry-only systems, in contrast, may allow for the collection of electronic validation records pertaining only to the entry of a traveler on a vehicle or at an origin node of the transportation system 134. While the destinations of travelers in an entry-exit system may be discernible from the automatic ticketing validation data, i.e., the validation information 137 collected by the automatic ticket validation systems 136, destinations of passengers in an entry-only automatic ticketing validation system 136 may be discerned through inferences based upon non-validation data (e.g., transportation system routes and schedules, event occurrences (sports, concerts, etc.), or the like) and traveler assumptions.

The systems and methods described herein may use one-trip tickets as well as prepaid cards, which are reflected in the ticket identification 145 included in the collected validation information 137. A one trip ticket may have a fixed validation time, i.e., a period of time during which the ticket remains valid for use by a traveler. For example, in entry-only systems, the time during which the ticket is valid may be limited to 1 hour from the time of issuance/purchase, during which time travelers may change vehicles within the transportation network 134 without incurring an additional charge. The first validation of such a ticket may be identified by a sequence tag indicating 'First', whereas the second and subsequent validations during this validation time may be identified by a sequence tag indicating 'Correspondence'. The automatic ticketing validation systems 136 may allow for the use of multiple entry cards, which may provide for multiple entries by a traveler and long-term permanent cards to requesting travelers. It will be appreciated that the use of multiple entry cards may permit tracking traveling data of each card holding traveler, as well as allowing for time-based analysis of such travelers.

The automatic ticketing validation systems 136 may allow for location identification, corresponding to the entry or the entry and exit of a traveler. For example, the automatic ticketing validation systems 136 may enable each validation of a ticket to include a ticket ID 145, a timestamp 140 and a correspondence tag. Additionally, the automatic ticketing validation systems 136 can use automatic vehicle location subsystems to associate a ticket validation with the public transportation route 148, stop identifier (e.g., stop 143) and direction. Other methods for collecting validation information 137 may alternatively or additionally be used, including, mobile communication events, e.g., time-stamped antenna authentication sequences or other observations of the intersecting of scheduled activities and traveler schedules. The ticket validations, i.e., the validation information 137 collected in the automatic ticketing validation systems 136 may provide information for understanding the traveler flows in the transportation network 134. Information in a typical installation can be analyzed in order to provide valuable insights for the transit and public transportation agencies and assist in decision making processes.

The validation information 137 associated with the implementation of FIG. 1 is for example purposes only. Other applications outside of the public transportation example are also contemplated. For example, toll-road monitoring and management systems may also take advantage of the subject systems and methods, whereby validation information 137 is collected at toll-booths, upon entry and exit of a vehicle with respect to the associated toll road. Other embodiments, e.g., hospital monitoring of patient/employee entries and exits, secure facility monitoring, and the like, are also contemplated.

Figure 3:
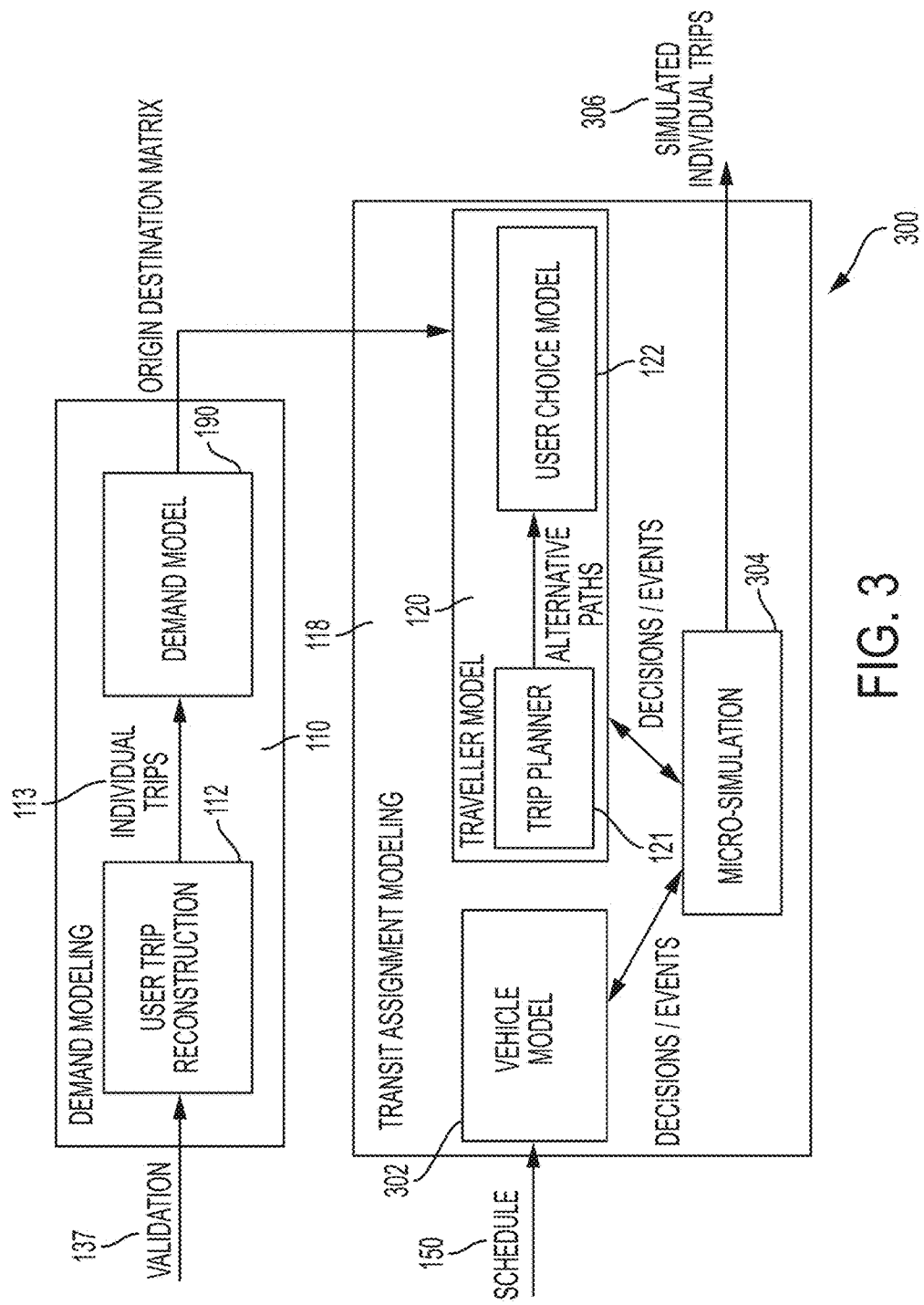
FIG. 3 illustrates a public transit micro-simulation data flow diagram according to one embodiment of the subject application.

Turning now to FIG. 3, there is shown a flow diagram 300 illustrating an example implementation of a public transit micro-simulation in accordance with embodiments of the subject application. In accordance with the flow diagram 300 of FIG. 3, it will be appreciated that the system 100 of the subject application may be utilized for a public transit simulation system which models at a micro-level the passengers. Accordingly, each individual passenger trip 113 with all the possible behaviors of the passenger is modelled.

As illustrated in FIG. 3, the demand modelling component 110 depicts a distinct improvement over a classical approach where a static origin destination matrix is built from a survey. In the subject application, a stochastic model of demand is learned from validation information 137 that will generate a sample of an origin destination matrix each time a simulation is launched. It utilizes a user trip reconstruction module 112 that translates validations 137 collected by a fare collection system 136 into individual trips 113 as described above. Then, using the same previously described method, the demand model 190 is generated estimating origin 115, destination 116, and time.

The second component of FIG. 3, the transit assignment modelling component 118 utilizes a traveler model component 120 that will be in charge of simulating each traveler's decisions and behaviors within the simulation. The schedule 150 of the transportation network 134 is used by the vehicle model component 302 to provide decision/event inputs to the micro-simulation component 304. The trip planner component 121 proposes some alternative paths according to the public infrastructure available. The user choice model component 122 simulates what will be the choice of the user at all decisions points, e.g., when walking to a stop: which stop, when to leave, what speed to walk; when being at a stop: which line, which vehicle to board; and when being in a vehicle: at what stop to leave. The traveler model component 120 further utilizes the demand model 190 and events/decisions from the simulation to refine the simulation. Thereafter, simulated individual trips 306 are output by the assignment model component 118. Accordingly, the validation information can be used in training mode in order to learn the best parameter values for the demand model 190, the trip planner 121 and the user choice model 122.

Figure 4A:
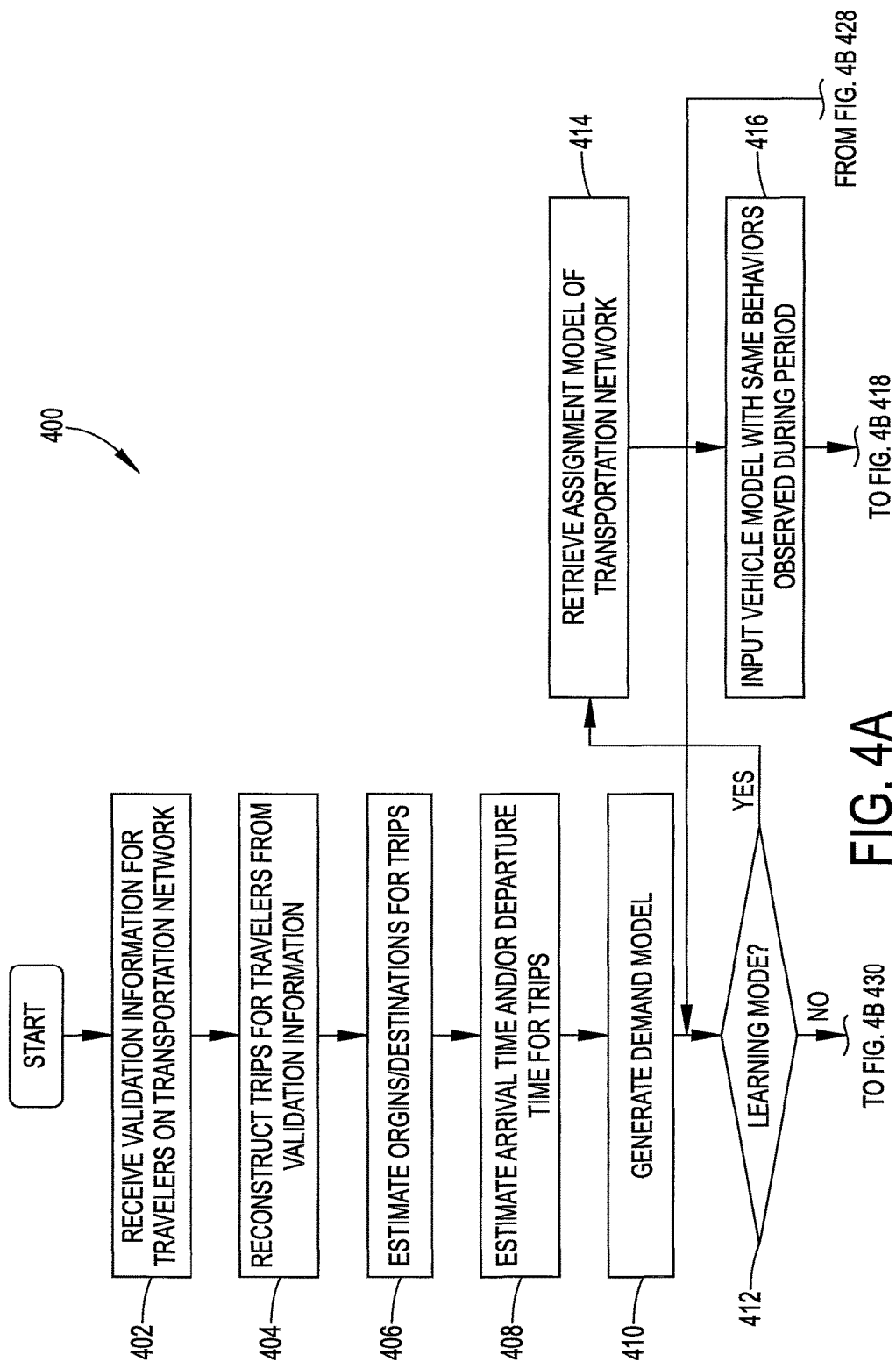
FIGS. 4A-4B is a flowchart which illustrates part of the method for learning transportation models on an associated transportation network in accordance with one aspect of the exemplary embodiment.
Figure 4B:
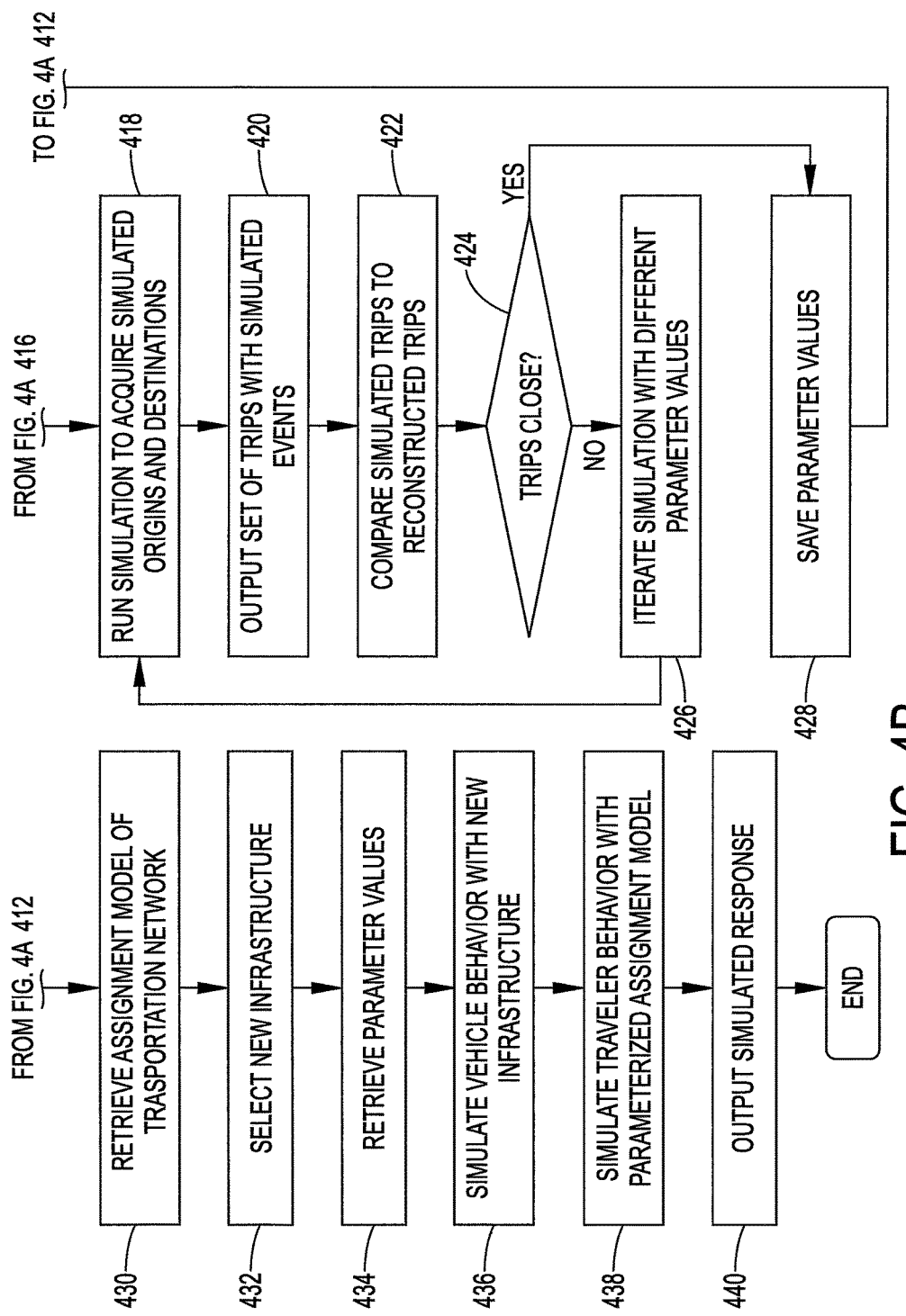

Turning now to FIGS. 4A-4B, there is shown a flowchart 400 illustrating a method for learning transportation models on an associated transportation network according to one embodiment. The methodology of FIGS. 4A-4B begins at 402, whereupon validation information 137 is received from at least one automatic ticketing validation systems 136, said validation information may include timestamps 140, locations 141 (e.g., stops 143) and ticket identifications 145. At 404, each trip 113 undertaken by a traveler, as indicated by the validation information 137, is reconstructed. Each trip 113 includes at least a timestamp 140, an origin 142, and a destination 144. The trip 111 may be reconstructed by the trip reconstruction module 112 from validation information 137 collected by one or more automatic ticketing validation systems 136.

At 406, origins 115 and destinations 116 are estimated via the origin and destination estimator 114 of the computer system 102 from the reconstructed trips 113. As discussed above, the estimation may involve a parameterized function such as a uniform or Gaussian distribution, may utilize historical traveler data (if known), or the like. At 408, a time is assigned to each trip via the time estimator 117. As previously discussed, the time may be the arrival time or the departure time, and may be determined differently for known and unknown users. A demand model 190 is then generated at 410 from the estimated origin, destination, and time, as was discussed in greater detail above.

A determination is then made at 412 whether a simulation to be performed corresponds to a learning mode or a predictive mode. Upon a determination at 412 that a learning mode is selected, operations proceed to 414, whereupon an assignment model 192 is retrieved from storage 133 corresponding to the transportation network 134 by the assignment model component 118. At 416, vehicle modeling is performed by forcing the vehicles of the transportation network 134 to operate and behave in accordance with the observed data, i.e., the vehicle operate as they did during the time period of the validation information 137 collected to generate the demand model 190. At 418, the simulator 124 operates to run a simulation to acquire a simulated set of origins and destinations. A set of trips with simulated events (based upon the simulated origins and destinations) is then output at 420.

At 422, the set of simulated trips is compared to the set of reconstructed trips 113 used to generate the demand model 190. A determination is then made at 424 whether the two sets are close enough in values. This closeness may correspond to a threshold difference between the individual trips, between the sets as a whole, or myriad other arbitrary or objective thresholds. Upon a determination that the trips are not close enough, operations progress to steep 426, whereupon one or more parameter values associated with the simulation are iterated and operations return to step 418 for additional simulations. Once the sets of trips are judged to be close enough, operations proceed to step 428, whereupon the parameter values are stored, i.e., the simulation model parameters are learned, and operations return to step 412.

Returning to step 412, upon a determination that prediction mode has been selected, operations progress to step 430. At 430, an assignment model 192 of the transportation network 134 is retrieved from associated storage 133. At 432, one or more infrastructure changes are made to the transportation network 134. It will be appreciated that the selection of infrastructure changes may include, for example and without limitation, route change, new stop added, new vehicle added, stop removed, new train line added, additional vehicles on same route, new train station, or myriad other additions or deletions to the infrastructure of the underlying transportation network 134. It will further be appreciated that such selection may be made via the user input devices 130 and 131, a remote terminal (not shown), or the like. The parameter values are then retrieved from associated storage 133 at 434. In accordance with one embodiment, the parameter values correspond to the previously learned assignment model 192 and may correspond to a particular time period, e.g., a day of the week, a week of the month, a month of the year, or myriad variations thereof.

At 436, vehicle behavior is then simulated on the transportation network 134 responsive to the infrastructure change(s). Traveler behavior, i.e., user choices, are then simulated at 438 on the assignment model parameterized with the best values learned at 428 and retrieved at 434. A simulated response of the transportation network 134 to the infrastructure change is then output by the system 102 at 440.

Figure 5A:
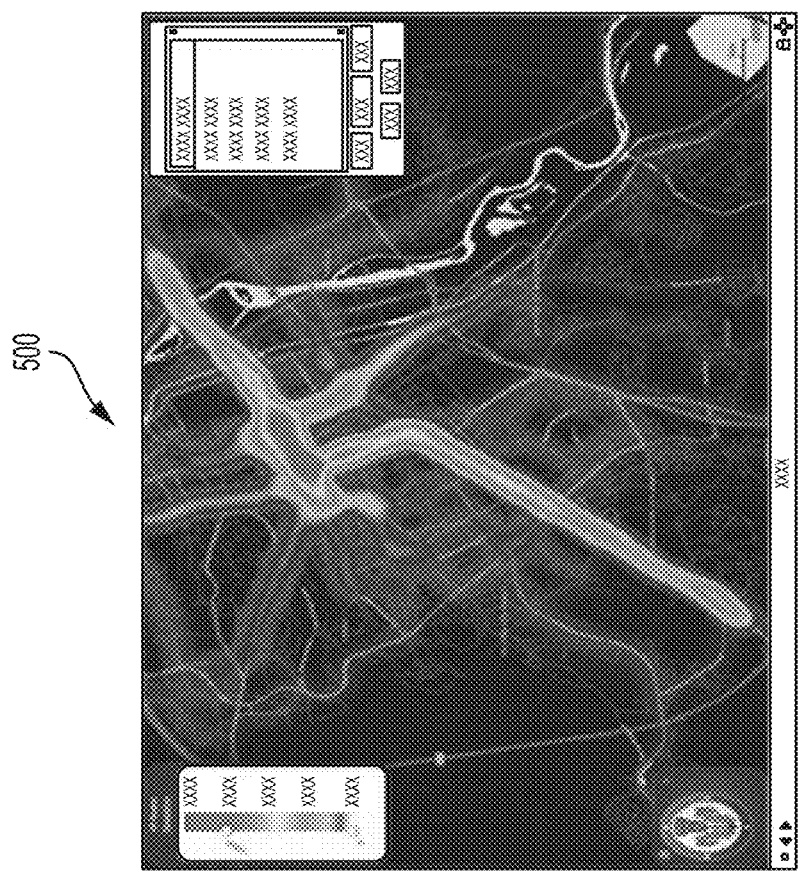
FIGS. 5A-5B illustrate a before and after view of a transportation network relating an infrastructure change simulated in accordance with one aspect of the exemplary embodiment.
Figure 5B:
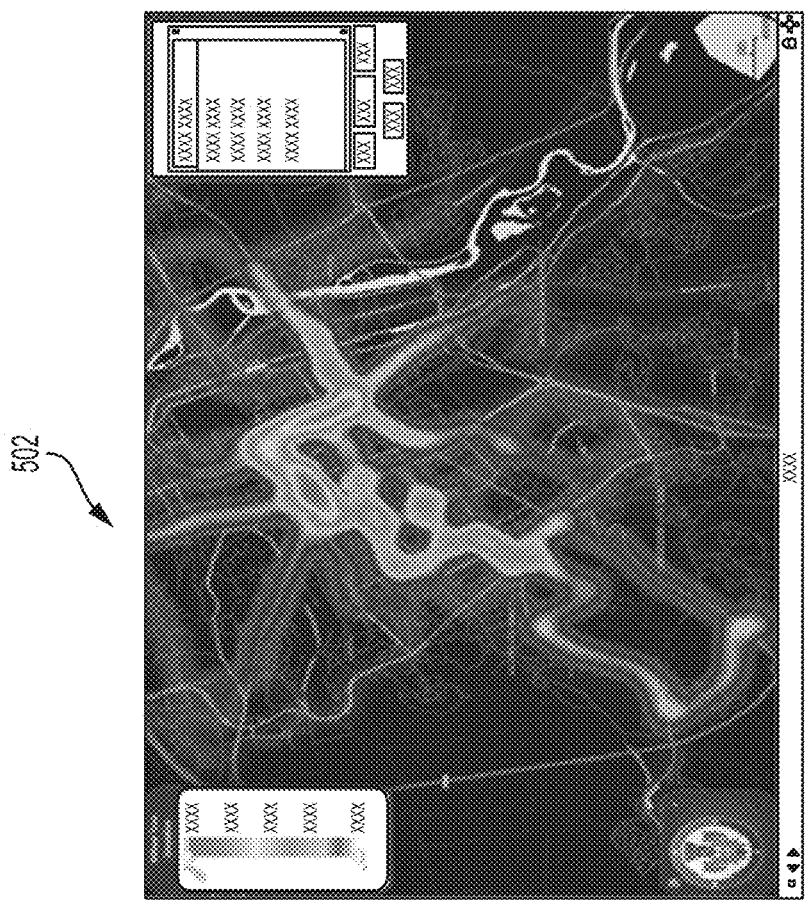

FIGS. 5A and 5B provide illustrations 500 and 502 depicting the simulated trips according to one embodiment of the subject application. As shown in FIGS. 5A-5B, comparative views of the vehicle load are depicted, aggregated as a heat map over the same time period in two different scenarios. Heat map 500 of FIG. 5A represents the vehicle load of the transportation network 134 that was observed in the real operations of the network 134. FIG. 5B illustrates a heat map 502 that visualizes a simulated response of the network 134 obtained when an infrastructure change, i.e., removal of a tram line, was made during the same reference period.

Figure 6:
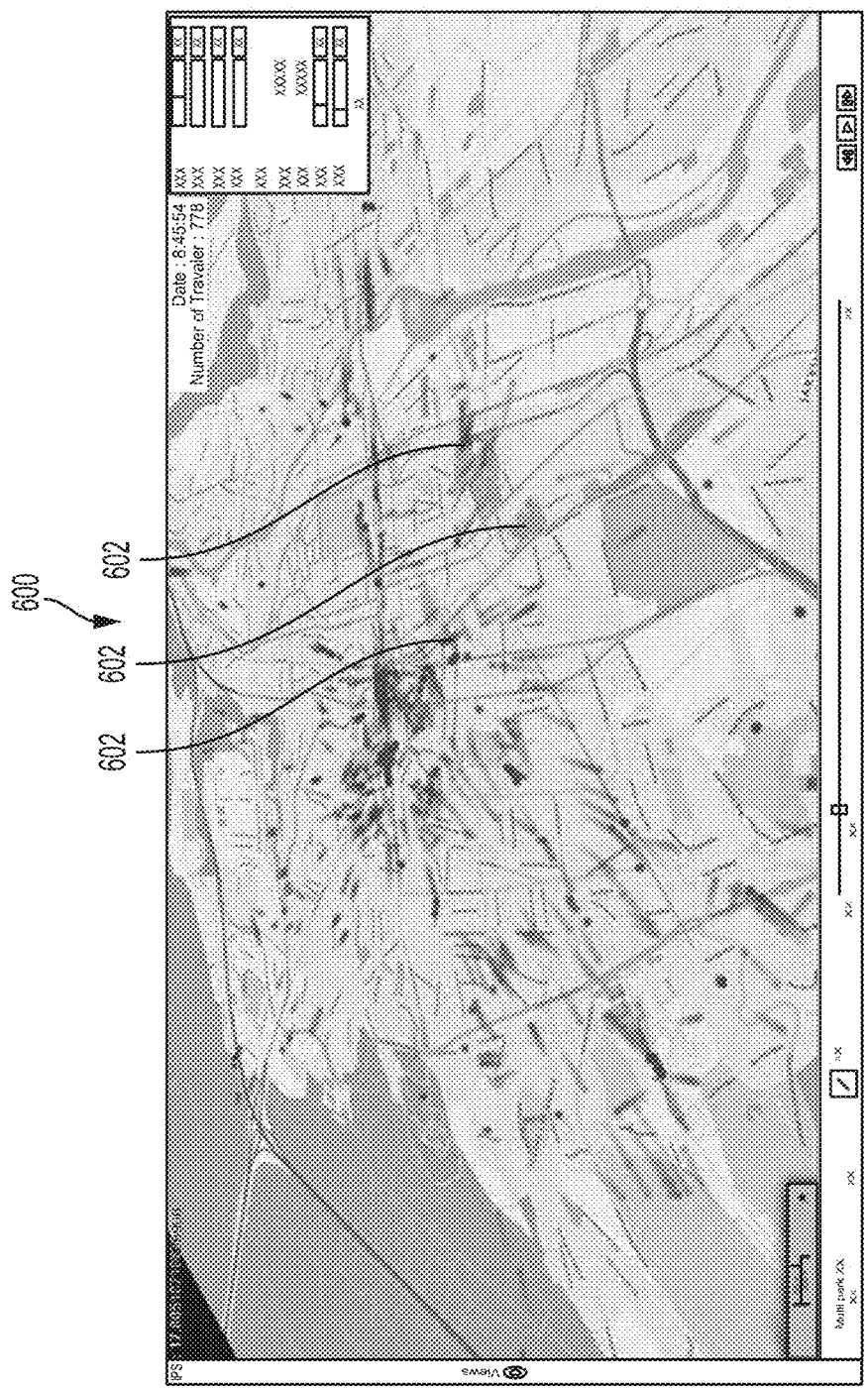
FIG. 6 illustrates a view of multiple simulated user positions and behaviors in accordance with one aspect of the exemplary embodiment.

FIG. 6 illustrates a screenshot map 600 of an example transportation network 134 provided to an administrator or manager of the network 134. It will be appreciated that as the simulated output of the system 100 reconstructs the whole trips 113 of each individual traveler, a dynamic representation of each individual trajectory 602 may be illustrated on a map 600 of the transportation network 134. In one example implementation, an administrator or other suitable personnel associated with management of the transportation network 134 may, via the display 130 and user input device 131, modify the illustration 600 to visualize the position and behavior of each simulated user 602 at any moment of time during the studied period.

It will be appreciated that the systems and methods disclosed herein provide a distinct improvement over current operations in that the systems and methods set forth above do not require a separate data collection phase, e.g., surveys or the like, in order to produce a simulation. Data gathering represents approximately one-third of the budget of planning departments of transportation authorities. In addition to a large reduction in the cost associated with infrastructure change simulations, the systems and methods disclosed herein provide a faster processing time, as the data collection of current systems and methods may require a year or more, depending upon the scale of the transportation network.

Furthermore, the systems and methods described herein provides up to date simulations, as the data used in the subject application is based upon validation information 137 collected by the transportation network 134 daily, resulting in an up-to-date representation of the demand upon the network 134. Similarly, traveler behaviors can be calibrated dynamically taking into consideration the most recent evolutions in the change of behavior, resulting in a more accurate simulation output.

In addition, the systems and methods employed herein may utilize historical traveler data, as the validation information 137 is collected and stored on a daily basis. This is a distinct improvement over survey data, as survey data merely represents a snapshot of mobility on a transportation network 134. The collected historical traveler data may be used to produce a more sophisticated model, thereby increasing the accuracy of the simulation output. It will be appreciated that the number of identified users with a payment history increases as payment technologies become cheaper and integrated into existing mediums (such as smart phones or credit cards).

Finally another improvement over existing simulation methodologies is that the validation information 137, i.e., fare collection data, covers the whole population of public transport users, i.e., travellers on the transportation network 134. This is particularly important for the training phase. In state of the art approaches, calibration of the parameters is done using a very limited amount of samples with a high risk of overfitting issues. The subject systems and methods provide complete coverage, thereby allowing for decomposition and cross-validation on time, space and population which reduces a lot the uncertainty of generalization and again has some positive effect on the simulation accuracy.

The systems and methods described above have been used together with a self-implemented public transit simulation system. This transportation system is implemented in PYTHON with a distributed framework allowing a large scale distribution of the traveler modelling component 120 in order to simulate transportation systems of real scale, i.e. hundred thousands or millions of individual trips in a day.

One critical dimension with this approach is the computational complexity involved with a micro-simulation at a metropolitan area scale. The self-implemented public transit simulation system is run with a public transportation network which includes around 2700 vehicles trip (buses and trams) and 100,000 individual passenger trips over one day. It can be qualified as a small to medium size network.

The system is run in a distributed computing infrastructure with around 200 processing cores. In such infrastructure one simulation of a full day in one core is computed within 1 to 2 minutes. Such fast processing time allows decision makers to test various planning alternatives in a very responsive way. The training phase, as will be understood, requires additional time, however this additional time is still orders of magnitude less than a survey collection would require, e.g., roughly 1 week of computation for training enable around 2,000,000 iterations.

The method illustrated in FIGS. 3-4B may be implemented in a computer program product that may be executed on a computer. The computer program product may comprise a non-transitory computer-readable recording medium on which a control program is recorded (stored), such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The exemplary method may be implemented on one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like. In general, any device, capable of implementing a finite state machine that is in turn capable of implementing the charts shown in FIGS. 3-4B can be used to implement the method for crowdsourcing a transportation network.

It will be appreciated that variants of the above-disclosed and other features and functions, or alternatives thereof, may be combined into many other different systems or applications. Various presently unforeseen or unanticipated alternatives, modifications, variations or improvements therein may be subsequently made by those skilled in the art which are also intended to be encompassed by the following claims.

What is claimed is:

1. A method for learning transportation models of an associated transportation network, comprising:
   receiving validation information from at least one ticketing validation system, the validation information including at least one of a timestamp, a location, or a ticket identification of a traveler on the associated transportation network;
   reconstructing each of a plurality of trips in accordance with the received validation information;
   estimating an origin and a destination from the reconstructed plurality of trips;
   estimating at least one of an arrival time or a destination time corresponding to each of the plurality of reconstructed trips;
   generating a demand model of the associated transportation network in accordance with the estimated origin, destination and the estimated at least one of the arrival time or the destination time;
   retrieving, from an associated database, an assignment model of the associated transportation network;
   simulating the transportation network in accordance with the assignment model to acquire origins, destinations and the estimated at least one of the arrival time or the destination time;
   reconstructing a set of simulated trips derived from the simulated origins, destinations, and the estimated at least one of the arrival time or the destination time;
   comparing the set of simulated trips to a corresponding set of reconstructed trips;
   determining, from the comparing, a difference between the set of simulated trips and the corresponding set of reconstructed trips;
   in response to the determined difference, iteratively adjusting at least one parameter value associated with the assignment model;
   receiving, from an associated user device, a selection of an infrastructure change to the transportation network the infrastructure change comprising at least one of a route change, a new stop added, a new vehicle added, a stop removed, a new train line added, an addition of one or more vehicles on a same route, or a new train station; and
   simulating the transportation network in accordance with the iteratively adjusted parameter value associated with the assignment model utilizing the selected infrastructure change and providing to the user the simulated transportation network,
   wherein at least one of the receiving, reconstructing, estimating, generating, retrieving, simulating, comparing, determining, and adjusting is performed by a computer processor.

2. The method of claim 1, further comprising:
   selecting at least one new infrastructure for the associated transportation network;
   parameterizing the assignment model in accordance with the at least one iteratively adjusted parameter value;

simulating the parameterized assignment model in accordance with the selected at least one new infrastructure; and outputting a simulated response of the associated transportation network corresponding to a result of the parameterized assignment model simulation.

3. The method of claim 2, wherein simulating the parameterized assignment model further comprises:

simulating, for each of a plurality of vehicles of the associated transportation network, vehicle behavior responsive to the at least one new infrastructure;

simulating, for each of a plurality of travelers, a plurality of decision points corresponding to travel on the associated transportation network responsive to the at least one new infrastructure; and outputting the simulated response of the associated transportation network in accordance with the simulated vehicle behavior and the simulated traveler decision points.

4. The method of claim 3, wherein the plurality of decision points include a stop, a time to leave for arrival at a stop, a speed to walk to a stop, a line of the associated transportation network accessible at a stop, a vehicle to board at a stop, a stop from which to depart a vehicle.

5. The method of claim 1, wherein the associated transportation network is a public transportation network.

6. The method of claim 1, wherein the estimating an origin and destination further comprises for each user having historical data associated therewith, modelling an origin and a destination from a linear combination of a distribution of stops around each of a first observed boarding and a last observed alighting, wherein a weight assigned to each stop distribution is determined in accordance with a frequency of observations of the stop.

7. The method of claim 1, wherein estimating the time further comprises:

for each user without a travel history, determining the arrival time by adding to an observed time of a last alighting an estimated walking duration from a stop corresponding to the last alighting to a final destination, and determining a departure time by adding to an observed time of a first boarding an estimated walking duration from an origin to a stop associated with the first boarding; and for each user with a travel history, determining the arrival time by adding to an observed time of a last alighting an estimated walking duration from a stop corresponding to the last alighting to a final destination for each instance of a trip in the travel history corresponding thereto, and determining a departure time by adding to an observed time of a first boarding an estimated walking duration from an origin to a stop corresponding to the first boarding for each instance of a trip in the travel history corresponding thereto.

8. A computer program product comprising a non-transitory recording medium storing instructions, which when executed on a computer causes the computer to perform the method of claim 1.

9. A system comprising memory storing instructions for performing the method of claim 1, and a processor in communication with the memory which implements the instructions.

10. A system for learning transportation models on an associated transportation network, comprising:

a demand model construction component comprising:
 a trip reconstruction module configured to receive validation information from at least one ticketing validation system and reconstruct a plurality of trips on the associated transportation network;
 an origin and destination estimator configured to estimate an origin and a destination for each of the plurality of reconstructed trips, and
 a time estimator configured to estimate at least one of an arrival time or a destination time for each of the plurality of reconstructed trips;

an assignment model component comprising:
 a traveler model component including a trip planner,
 a vehicle model component, and
 a simulator;

a memory; and a processor in communication with the memory which stores instructions that are executed by the processor to:
 generate a demand model in accordance with the estimated origins, destinations, and the estimated at least one of the arrival time or the destination time,
 retrieve, from an associated database, an assignment model corresponding to the associated transportation network,
 input, into the retrieved assignment model, a vehicle model of the associated transportation network, the vehicle model corresponding to operations of vehicles on the associated transportation network,
 simulate the assignment model to determine a set of simulated trips,
 determine a difference between the set of simulated trips and the plurality of reconstructed trips,
 iteratively simulate the assignment model with different parameter values responsive to a determined difference,
 output a set of parameter values for predictive modeling of the transportation network,
 receive, from an associated user device, a selection of an infrastructure change to the transportation network the infrastructure change comprising at least one of a route change, a new stop added, a new vehicle added, a stop removed, a new train line added, an addition of one or more vehicles on a same route, or a new train station, and
 simulate the transportation network in accordance with the assignment model and the selected infrastructure change using the output set of parameter values and provide to the user the simulated transportation network.

11. The system of claim 10, wherein the memory further stores instructions executed by the processor to:

select at least one new infrastructure for the associated transportation network;

parameterize the assignment model in accordance with at least one iteratively adjusted parameter value from the iterative simulation of the assignment model;

simulate the parameterized assignment model in accordance with the selected at least one new infrastructure; and output a simulated response of the associated transportation network corresponding to a result of the parameterized assignment model simulation.

12. The system of claim 11, wherein the memory further stores instructions executed by the processor to:

simulate, for each of the vehicles of the associated transportation network, vehicle behavior responsive to the at least one new infrastructure;

simulate, for each of a plurality of travelers, a plurality of decision points corresponding to travel on the associated transportation network responsive to the at least one new infrastructure; and output the simulated response of the associated transportation network in accordance with the simulated vehicle behavior and the simulated traveler decision points.

13. The system of claim 12, wherein the plurality of decision points include a stop, a time to leave for arrival at a stop, a speed to walk to a stop, a line of the associated transportation network accessible at a stop, a vehicle to board at a stop, a stop from which to depart a vehicle.

14. The system of claim 10, wherein the origin and destination estimator is further configured to:

for each user having historical data associated therewith, model an origin and a destination from a linear combination of a distribution of stops around each of a first observed boarding and a last observed alighting, wherein a weight assigned to each stop distribution is determined in accordance with a frequency of observations of the stop.

15. The system of claim 10, wherein the time estimator is further configured to:

for each user without a travel history, estimate the arrival time by adding to an observed time of a last alighting an estimated walking duration from a stop corresponding to the last alighting to a final destination, and estimate a departure time by adding to an observed time of a first boarding an estimated walking duration from an origin to a stop associated with the first boarding; and for each user with a travel history, estimate the arrival time by adding to an observed time of a last alighting an estimated walking duration from a stop corresponding to the last alighting to a final destination for each instance of a trip in the travel history corresponding thereto, and estimate a departure time by adding to an observed time of a first boarding an estimated walking duration from an origin to a stop corresponding to the first boarding for each instance of a trip in the travel history corresponding thereto.

16. A computer-implemented method for learning transportation models of associated public transportation network, comprising:

receiving validation information from at least one ticketing validation system, the validation information including at least one of a timestamp, a location, or a ticket identification of a traveler on the associated transportation network;

reconstructing each of a plurality of trips in accordance with the received validation information;

estimating an origin and a destination from the reconstructed plurality of trips, wherein for each user having historical data associated therewith, determining the origin and the destination from a linear combination of a distribution of stops around each of a first observed boarding and a last observed alighting;

estimating at least one of an arrival time or a destination time corresponding to each of the plurality of reconstructed trips;

generating a demand model of the associated transportation network in accordance with the estimated origin, destination and the estimated at least one of the arrival time or the destination time;

retrieving, from an associated database, an assignment model of the associated transportation network;

simulating the transportation network in accordance with the assignment model to acquire origins, destinations and the estimated at least one of the arrival time or the destination time;

reconstructing a set of simulated trips derived from the simulated origins, destinations, and the estimated at least one of the arrival time or the destination time;

comparing the set of simulated trips to a corresponding set of reconstructed trips;

determining, from the comparing, a difference between the set of simulated trips and the corresponding set of reconstructed trips;

in response to the determined difference, iteratively adjusting at least one parameter value associated with the assignment model;

receiving, from an associated user device, a selection of an infrastructure change to the transportation network the infrastructure change comprising at least one of a route change, a new stop added, a new vehicle added, a stop removed, a new train line added, an addition of one or more vehicles on a same route, or a new train station; and simulating the transportation network in accordance with the iteratively adjusted parameter value associated with the assignment model utilizing the selected infrastructure change and providing to the user the simulated transportation network.

17. The computer-implemented method of claim 16, further comprising:

selecting at least one new infrastructure for the associated transportation network;

parameterizing the assignment model in accordance with the at least one iteratively adjusted parameter value;

simulating, for each of a plurality of vehicles of the associated transportation network, vehicle behavior responsive to the at least one new infrastructure;

simulating, for each of a plurality of travelers, a plurality of decision points corresponding to travel on the associated transportation network responsive to the at least one new infrastructure and the parameterized assignment model; and outputting the simulated response of the associated transportation network in accordance with the simulated vehicle behavior and the simulated traveler decision points.

* * * * *